(12) United States Patent
Tokuda

(10) Patent No.: US 10,223,974 B2
(45) Date of Patent: Mar. 5, 2019

(54) DISPLAY DEVICE

(71) Applicant: Japan Display Inc., Tokyo (JP)

(72) Inventor: Naoki Tokuda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/719,666

(22) Filed: Sep. 29, 2017

(65) Prior Publication Data

US 2018/0114491 A1  Apr. 26, 2018

(30) Foreign Application Priority Data

Oct. 21, 2016  (JP) .................. 2016-206766

(51) Int. Cl.
| | |
|---|---|
| *H01L 27/32* | (2006.01) |
| *H01L 51/00* | (2006.01) |
| *G09G 3/3233* | (2016.01) |
| *G09G 3/3266* | (2016.01) |

(52) U.S. Cl.
CPC ......... *G09G 3/3266* (2013.01); *G09G 3/3233* (2013.01); *H01L 27/3258* (2013.01); *H01L 27/3265* (2013.01); *H01L 27/3276* (2013.01); *H01L 51/0097* (2013.01); *G09G 2310/027* (2013.01); *G09G 2310/0213* (2013.01); *G09G 2380/02* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 8,072,437 | B2 * | 12/2011 | Miller | G06F 3/0414 |
| | | | | 345/173 |
| 9,563,320 | B2 * | 2/2017 | Lee | G01L 1/2206 |
| 9,601,557 | B2 * | 3/2017 | Yang | H01L 27/1218 |
| 9,786,229 | B2 * | 10/2017 | Lee | G09G 3/3225 |
| 10,026,357 | B2 * | 7/2018 | Sohn | G09G 3/3225 |
| 10,038,154 | B2 * | 7/2018 | Lee | H01L 51/0097 |
| 10,048,822 | B2 * | 8/2018 | Hong | G06F 3/044 |
| 2012/0092363 | A1 * | 4/2012 | Kim | G06T 5/006 |
| | | | | 345/618 |
| 2015/0091016 | A1 * | 4/2015 | Chen | G09G 3/3225 |
| | | | | 257/72 |
| 2016/0246432 | A1 * | 8/2016 | Hong | G06F 3/0412 |
| 2016/0254328 | A1 * | 9/2016 | Song | H01L 27/3225 |
| | | | | 324/699 |
| 2016/0349878 | A1 * | 12/2016 | Kim | G02F 1/133305 |
| 2017/0097721 | A1 * | 4/2017 | Wang | G06F 1/1652 |
| 2017/0102738 | A1 * | 4/2017 | Park | G06F 1/1652 |

FOREIGN PATENT DOCUMENTS

JP    2014-151617 A    8/2014

* cited by examiner

*Primary Examiner* — Chad M Dicke

(74) *Attorney, Agent, or Firm* — Typha IP LLC

(57) ABSTRACT

A display device includes a flexible substrate, a plurality of pixels arranged in a first direction and a second direction intersecting the first direction, and a first wiring and a second extending in the first direction and a first insulating film, wherein the first insulating film is included between the first wiring and the second wiring, the first wiring and the second wiring include a part having elasticity, the first insulating film includes elasticity, and an interval between the first wiring and the second wiring changes as the flexible substrate stretches and contracts.

13 Claims, 22 Drawing Sheets

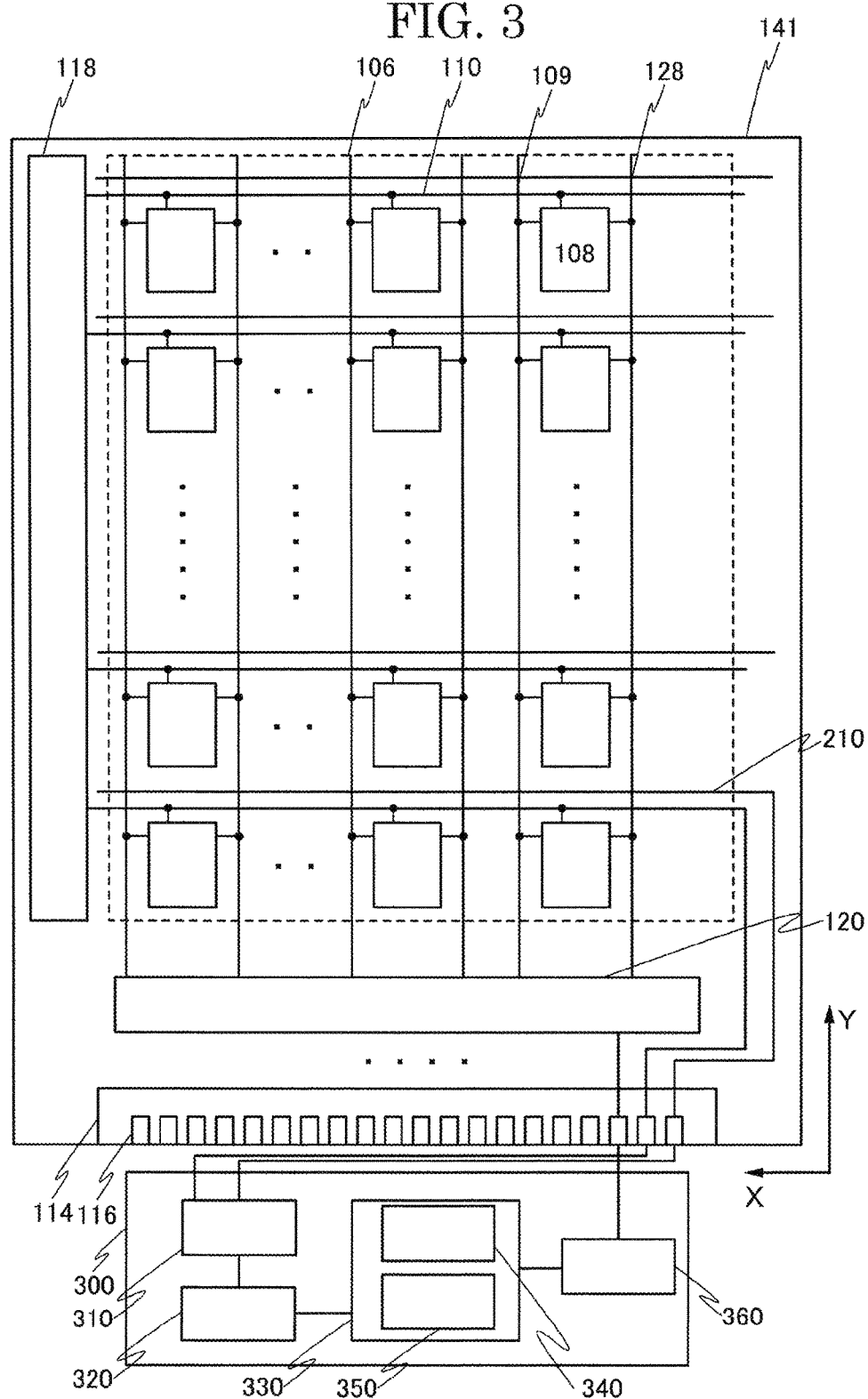

DISPLAY DEVICE

CROSS REFERENCE TO RELATED APPLICATIONS

This application is based upon and claims the benefit of priority from the prior Japanese Patent Application No. 2016-206766, filed on Oct. 21, 2016, the entire contents of which are incorporated herein by reference.

FIELD

The present invention is related to a display device having elasticity. An embodiment of the present invention is related to a display device having a function for detecting elasticity of a pixel region.

BACKGROUND

An organic electroluminescence (EL) display device (hereinafter referred to as an EL display device) includes a plurality of transistors and organic light emitting elements (referred to as light emitting elements herein) in each of a plurality of pixels formed on a substrate. Each pixel is driven by a signal which controls a pixel. A current is supplied to a light emitting element by controlling the driving of a transistor included in each pixel by a signal, and thereby a display device can display an image. An organic EL display device is suitable for flexibility and thinning because a light emitting element has a stacked structure of thin organic films and a backlight is unnecessary. A so-called flexible display (sheet display) in which a light emitting element is manufactured on a flexible substrate is manufactured utilizing this characteristic. In addition, examinations are being carried out in order to attach a flexible display to a curved surface, clothing or a human body and the like. In the case of attaching a flexible display to a curved surface, clothing or a human body, the ease of attachment becomes important, and elasticity is also necessary.

For example, an elastic wiring substrate including elastic wiring above an elastic base material is known.

SUMMARY

An embodiment of the present invention is a display device including a flexible substrate, a plurality of pixels arranged in a first direction and a second direction intersecting the first direction, and a first wiring and a second extending in the first direction and a first insulating film, wherein the first insulating film is included between the first wiring and the second wiring, the first wiring and the second wiring include a part having elasticity, the first insulating film includes elasticity, and an interval between the first wiring and the second wiring changes as the flexible substrate stretches and contracts.

BRIEF DESCRIPTION OF DRAWINGS

FIG. 3 is a schematic planar view diagram of a display device related to one embodiment of the present invention;

DESCRIPTION OF EMBODIMENTS

Figure 1A:
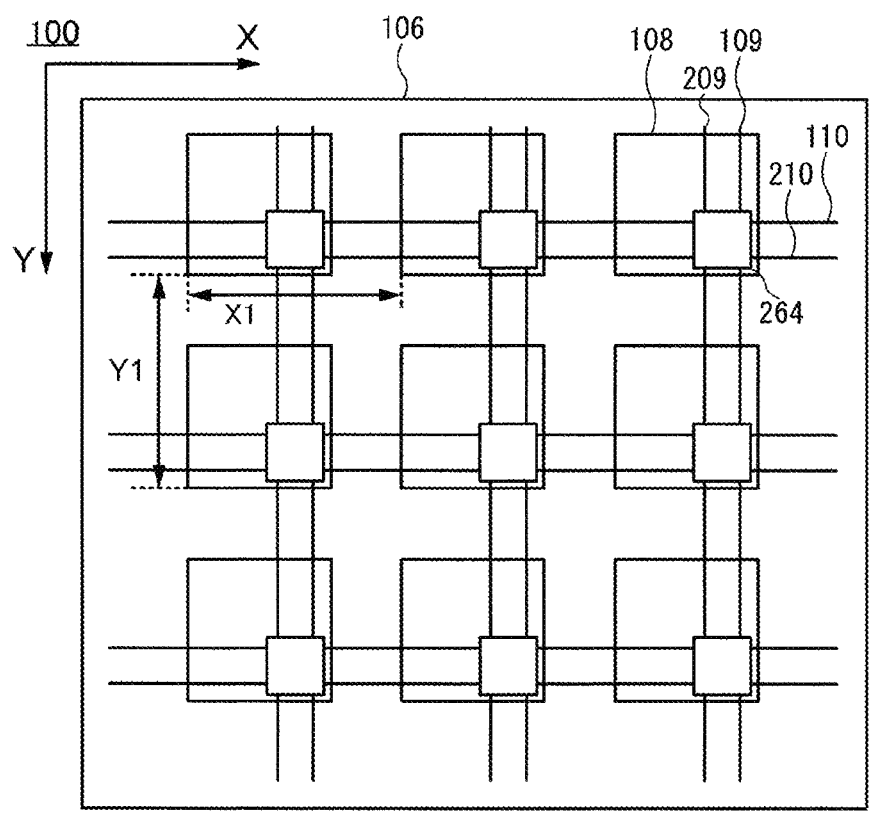
FIG. 1A is a schematic planar view diagram of a pixel region included in a display device related to one embodiment of the present invention.

The embodiments of the present invention are explained below while referring to the diagrams. However, it is possible to perform the present invention using many different forms, and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols (or symbols attached with a, b and the like after numbers) are attached to similar elements and elements that have been mentioned in previous drawings, and therefore a detailed explanation may be omitted where appropriate. Furthermore, characters denoted by [first], [second] with respect to each element are appropriate marks used to distinguish each element and unless otherwise explained do not include any further meaning.

In the present specification, in the case where certain parts or regions are given as [above (or below)] other parts or regions, as long as there is no particular limitation, these include parts which are not only directly above (or directly below) other parts or regions but also in an upper direction (or lower direction). That is, in the case where certain parts or regions are given as [above (or below)] other parts or regions, other structural elements may be included between other parts or regions in an upper direction (or lower direction). Furthermore, as long as there is no particular limitation, the side arranged with a second substrate with respect to the first substrate in a cross-sectional view is called [upper] or [above] and the reverse is called [lower] or [below].

The first substrate explained in the present specification includes at least one planar shaped main surface and each of an insulation layer, a semiconductor layer, a conducting layer or each element such as transistors and display elements are arranged on this one main surface. In the explanation below, in the case where an explanation is given of [upper], [upper layer], [above] or [upper surface] with respect to the first substrate when one main surface of the first substrate is set as a reference in a cross-sectional view, as long as there is no particular limitation, the explanation is provided using one main surface of the first substrate as a reference.

When a flexible display can be stretched and contracted, the size of a screen can also be changed in addition to conventional bending characteristics. Specifically, a change in the size of a display and adhesion is possible to a surface which is not a flat surface such as a curved surface or clothes and the like. Even when it is possible to change the form of a flexible display in this way, a method for detecting the form of such a change and reflecting this in the operation of a flexible display or of an entire system has not been examined.

On the other hand, when the flexible display becomes stretchable and contractable, problems such as image distortion occur. In addition, a flexible display has a structure in which a large number of films are stacked. Each of the films includes a plurality of wirings formed for controlling transistors of a pixel and an insulating film for protecting the wirings. Therefore, when the flexible display becomes stretchable and contractable, the wirings and the insulating film also stretch and contract, and there is a fear that operation may be affected. For example, there is a fear that impedance of wiring arranged in a driving circuit or pixel region changes which may affect the operation of the flexible display.

In an attempt to solve these problems, one embodiment of the present invention aims to provide a display device having flexibility.

(First Embodiment)

In the present embodiment, a display device having flexibility related to one embodiment of the present invention is explained. In addition, a display device having flexibility and capable of detecting the flexibility by a change in volume is explained.

Figure 1B:
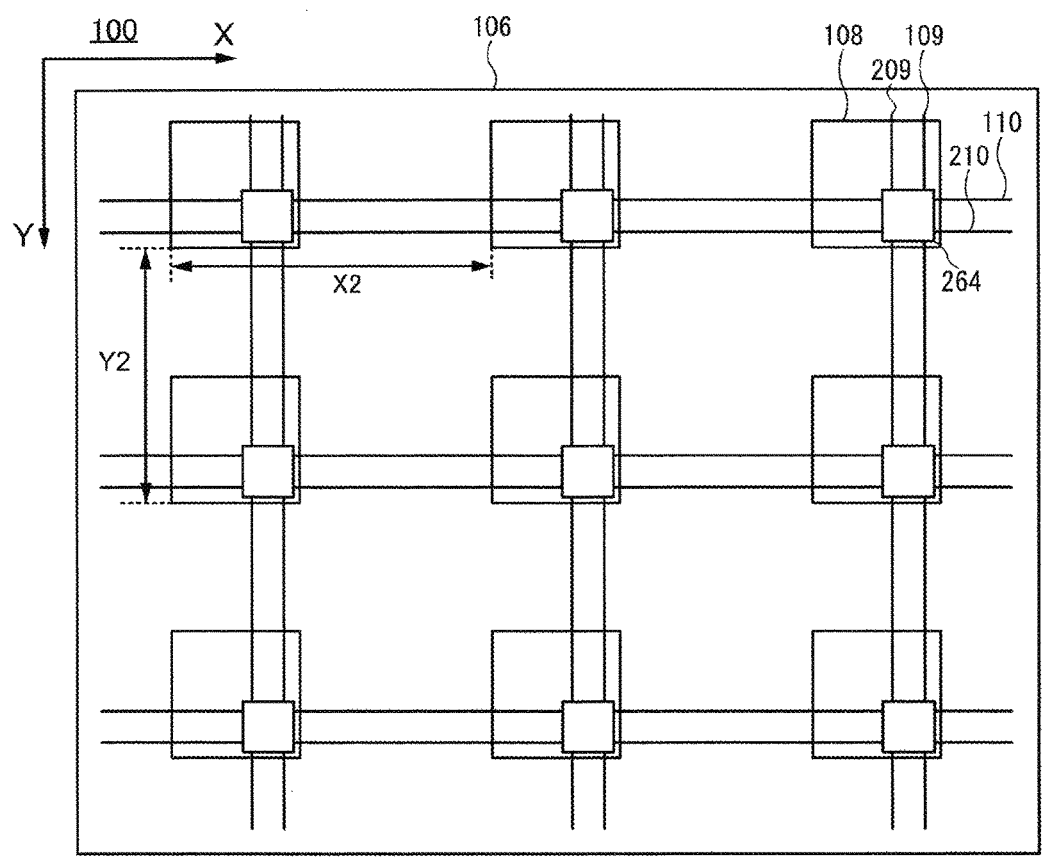
FIG. 1B is a schematic planar view diagram of a pixel region included in a display device related to one embodiment of the present invention.
Figure 2A:
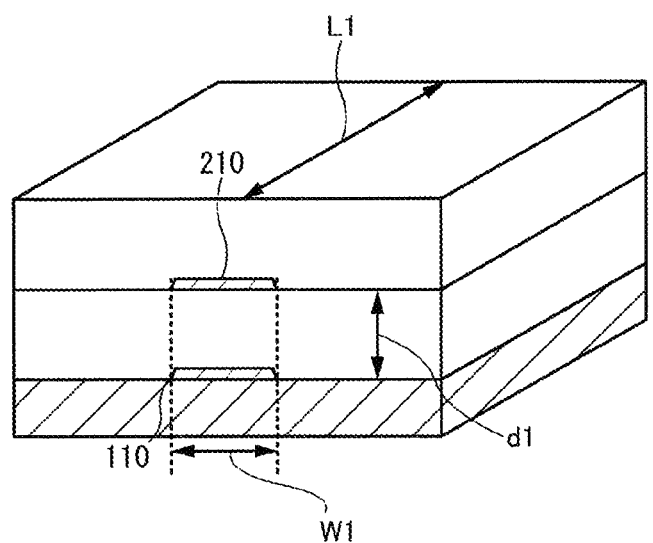
FIG. 2A is a schematic cross-sectional diagram of a wiring included in a display device related to one embodiment of the present invention.
Figure 2B:
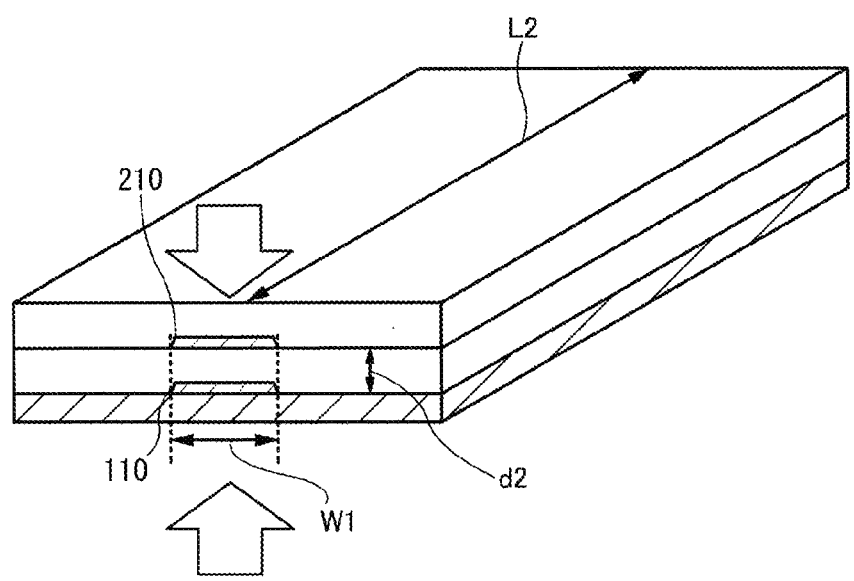
FIG. 2B is a schematic cross-sectional diagram of a wiring included in a display device related to one embodiment of the present invention.

FIG. 1A and FIG. 1B are schematic planar diagrams of a pixel region 106 included in a display device 100 related to one embodiment of the present invention. FIG. 2A and FIG. 2B are schematic cross-sectional diagrams of wirings included in the pixel region 106 included in the display device 100 related to one embodiment of the present invention.

A plurality of pixels 108 are arranged in the pixel region 106 along a first direction and a second direction intersecting the first direction. The number of the plurality of pixels 108 is arbitrary. For example, m pixels 108 are arranged in an X direction and n pixels 108 are arranged in a Y direction. The code m and n are each independently a natural number larger than 1. In FIG. 1A and FIG. 1B, an example is shown in which the arrangement of a plurality of pixels 108 is 4 rows and 4 columns. A plurality of scanning signal lines 110 and a plurality of first intermediate wirings 210 extended in parallel in the X direction. A plurality of image signal lines 109 and a plurality of second intermediate wirings 209 extended in parallel in the Y direction. In FIG. 1A and FIG. 1B, in order to promote understanding, a scanning signal line 110 and the first intermediate wiring 210 are arranged in parallel, and an image video signal line 109 and the second intermediate wiring 209 are also arranged in parallel. The scanning signal line 110 and the first intermediate wiring 210 may overlap each other. The image signal line 109 and the second intermediate wiring 209 may also overlap each other. Each pixel 108 is arranged with a pixel circuit. In FIG. 1A and FIG. 1B, in order to promote understanding, only a transistor 264 is shown in the pixel circuit. A pixel circuit includes a plurality of transistors and a capacitor.

A part of or all of the plurality of scanning signal lines 110, the plurality of image signal lines 109, the plurality of first intermediate wirings 210 and the second intermediate wiring 209 may have elasticity. That is, a part of or all of each signal line and the respective wirings may be formed from a material having elasticity.

FIG. 1A shows a state in which the display device is not stretched or contracted (also referred to as non-elastic state, a standard state or steady state). X1 indicates an interval between pixels in the X direction, and Y1 indicates an interval between pixels in the Y direction. FIG. 1B shows a state in which the display device is extended vertically in the X direction and horizontally in the Y direction. X2 indicates an interval between pixels in the X direction, and Y2 indicates an interval between pixels in the Y direction. X2 is longer than X1 and Y2 is longer than Y1. It is understood that the wirings are extended since the plurality of scanning signal lines 110, the plurality of image signal lines 109, the plurality of first intermediate wirings 210 and the second intermediate wiring 209 are wirings formed using a material having elasticity.

Detection of stretching or contraction of wiring is performed in the following procedure. A capacitance value of a scanning signal line 110 and first intermediate wiring 210 is measured when the pixel region 106 of the display device is in a standard state (FIG. 1A). Next, a capacitance value of the scanning signal line 110 and the first intermediate wiring 210 is measured when the pixel region 106 of the display device is in a stretched state (FIG. 1B). The two capacitance values are compared. Next, a capacitance value of an image signal line 109 and second intermediate wiring 209 is measured when the pixel region 106 of the display device is in a standard state (FIG. 1A). Furthermore, a capacitance value of the image signal line 109 and second intermediate wiring 209 is measured when the pixel region 106 of the display device is in a stretched state (FIG. 1B). The two capacitance values are compared.

FIG. 2A and FIG. 2B respectively show a cross-sectional view (FIG. 2A) of the scanning signal line 110 and the first intermediate wiring 210 when the pixel region 106 of the display device is in a standard state (FIG. 1A) and a cross-sectional view (FIG. 2B) when the pixel region 106 of the display device is in a stretched state (FIG. 1B). For example, in the case when the scanning signal line 110 and the first intermediate wiring 210 are regarded as a parallel flat plate capacitor, the capacitance value is expressed by the following equation in which a wiring overlap region is given as S1, a wiring width is W1, a wiring length is L1, the distance between parallel plates (which may also be called an interval) is d1 and the relative permittivity of a film between parallel plates is ε.

$$C = \varepsilon \frac{S1}{d1}$$

When the overlapping region of a wiring is given as S2, the length of the wiring is L2, and the distance between parallel flat plates (which may also be called an interval) is d2 when the pixel region 106 of the display device is in a stretched state, L2 is longer than L1 and d2 is shorter than d1. Therefore, according to equation 1, the capacitance value when the pixel region 106 of the display device is in a stretched state (FIG. 1B) is larger than the capacitance value when the pixel region 106 of the display device in the standard state (FIG. 1A). In this way, it is possible to detect stretching and contraction of the wiring in the X direction and the Y direction. In addition, it can be understood that the pixel region 106 of the display device is enlarged in the X direction and the Y direction.

In FIG. 1A and FIG. 1B, the detection of stretching and contraction of wiring in a state where the pixel region 106 of the display device is stretched was explained. The detection of wiring in a state where the pixel region 106 of the display device is contracted is the same. In a state where the pixel region 106 of the display device is contracted, the length of the wiring is shorter and the distance between the parallel flat plates is longer compared with when the pixel region 106 of the display device is in the standard state. Therefore, according to equation 1, the capacitance value when the pixel region 106 of the display device is in a stretched state (FIG. 1B) is smaller than the capacitance value when the pixel region 106 of the display device is in the standard state (FIG. 1A). In this way, it is possible to detect stretching and contraction of the wiring in the X direction and the Y direction. It can be seen that the pixel region 106 of the display device is contracted in the X direction and the Y direction.

Detection of stretching and contraction of the wiring was explained above by taking as an example the state when the pixel region 106 of the display device is stretched in the X direction and the Y direction. Furthermore, it is possible to detect stretching and contraction of the wiring even in a state in which the pixel region 106 of the display device is stretched in either the X direction or the Y direction. Even when the pixel region 106 of the display device is in a contracted state in least one of the X direction and the Y direction, it is possible to detect stretching and contraction of the wiring. That is, it is possible to detect stretching and contraction of the display device by measuring the capacitance value of the scanning signal line 110 and the first intermediate wiring 210 and the capacitance value of the image signal line 109 and the second intermediate wiring 209.

The capacitance value of wiring may be measured using an LCR meter or a capacitance meter. Measurement of the capacitance value of wiring can be performed using a device capable of measuring electrostatic capacitance.

Measurement of a capacitance value may be performed in a blank period between frames in which image signals are written for example. In advance, a (n−k) scanning signal line for measuring a capacitance value may be determined in advance and each signal line may be extended to a terminal electrode 116 (described below). At this time, each signal line may be separated from a scanning signal line driving circuit 118 and image signal line driving circuit 120 by a switch. Furthermore, measurement of a capacitance value does not have to be performed between frame periods as described above. In the case of dot sequential scanning, measurement may be performed in a horizontal flyback period between the (n−k) th scanning signal line and the (n−k+1) th scanning signal line. If measurement is possible, it may be performed in any state. N is a natural number larger than k and larger than 2. K is a natural number larger than 1.

By forming such a display device, it is possible to provide a display device having elasticity. For example, in a display device having elasticity, it is possible to display and input text data in the standard state, and enlarge and view the display screen when viewing an image. Specifically, it is assumed that the standard state is a mobile terminal device having a size of 5 inches. When this display screen is stretched in the X direction and the Y direction for example, the display region is enlarged, and can be used as a tablet terminal device having a size of 8 to 12 inches. Alternatively, when the display device is extended in the X direction, the display region is enlarged in the X direction for example, and it can be used as a tablet terminal device having a lateral length of 6 to 7 inches which is suitable for watching a movie. That is, a display device having elasticity can have a function for changing the size of a screen.

In addition, in a display device having elasticity, it is possible to detect whether the display region is enlarged or reduced by measuring the capacitance value of a scanning signal line 110 and first intermediate wiring 210 of the pixel region 106 included in the display device and the capacitance value of an image signal line 109 and second intermediate wiring 209.

(Second Embodiment)

In the present embodiment, in the display device having elasticity related to one embodiment of the present invention, feeding back an image signal which is corrected according to stretching and contraction after detecting the stretching and contraction by a change in capacitance is explained. Furthermore, explanation of the same structure as that of the first embodiment may be omitted.

FIG. 3 is a schematic planar view diagram of a display device 200 related to one embodiment of the present invention.

The display device 200 includes a pixel region 106 having a plurality of pixels 108 arranged in a first direction and a second direction intersecting the first direction, a scanning signal line driving circuit 118, and an image signal line driving circuit 120 on one surface (upper surface) of a flexible substrate 102. Each of the plurality of pixels 108 is electrically connected to the image signal line 109, the scanning signal line 110, and a driving power supply line. The pixel region 106, the scanning signal line driver circuit 118, and the image signal line driver circuit 120 region arranged between the flexible substrate 102 and a barrier film 104 (not shown in the diagram). The scanning signal line driver circuit 118 and the image signal line driver circuit 120 are manufactured separately from the pixel region 106 and may be connected to each scanning signal line and each image signal line via a connector such as a flexible printed circuit (FPC). Each type of signal from an external circuit (not shown in the diagram) is supplied to the flexible substrate 102 via a connector such as a flexible printed circuit (FPC) connected to a terminal region 114 including a plurality of electrode terminals 116 arranged on the flexible substrate 102, is input to the scanning line drive circuit 118 and the image signal line drive circuit 120, and each pixel 108 is controlled based on these signals.

An image processing circuit 300 is arranged on the outer side of the display device 200. The image processing circuit 300 is electrically connected to a scanning signal line 110, first intermediate wiring 210, image signal line 109, and the second intermediate wiring 209 of the display device 200 via the electrode terminal 116. The image processing circuit 300 includes a device 310 for measuring a capacitance value or a resistance value, an AD conversion circuit 320, a correction circuit 330 and a DA conversion circuit 360. The image processing device 300 may also include a comparator. The correction circuit 330 includes a memory 340 and an operational circuit 350. The image processing circuit 300 may also have a CPU. The correction circuit 330 may have a plurality of memories.

The operation of the image processing circuit 300 is explained. The device 310 for measuring a capacitance value or a resistance value measures the capacitance value of a scanning signal line 110 and the first intermediate wiring 210 when the pixel region 106 of the display device is in the standard state (FIG. 1A). Next, the capacitance value of the scanning signal line 110 and the first intermediate wiring 210 when the pixel region 106 of the display device is in a stretched state (FIG. 1B) is measured. Each measured capacitance value is an analog value. Each measured capacitance value is converted into a digital value by the AD conversion circuit 320. Each capacitance value converted into a digital value is sent to the correction circuit. Here, the difference between each capacitance value converted into a digital value may be calculated by the calculation device. The memory 340 includes data for associating information related to contraction of the display device with the relationship of a capacitance value. The correction circuit 330 associates information related to the contraction of the display device included in the memory 340 with the capacitance value converted into a digital value and sends correction data of an image signal supplied to an image signal line to the DA conversion circuit 360. The correction data of the image signal converted to an analog value by the DA conversion circuit 360 is supplied to each image signal line 109 via an electrode terminal 114 in the display device 100.

In FIG. 3, although the device 310 for measuring a capacitance value or resistance value included in the image processing circuit 300 is connected to the scanning signal line 110, it is also connected to an image signal line 109 (not shown in the diagram). Whether a capacitance value of the scanning signal line is measured or a capacitance value of an image signal line is measured may be switched by arranging a switch or by mounting two measurement devices 310 so that both can be measured at one time. In addition, in FIG. 3, correction data of an image signal converted to an analog value by the DA conversion circuit 360 is connected to one electrode terminal 114 of the display device 100. Each of a plurality of correction data of an image signals may be supplied to the plurality of image signal lines 109 via the plurality of electrode terminals 114.

The correction data of an image signal converted to an analog value by the DA conversion circuit 360 is supplied to each image signal line 109 via the electrode terminal 114 of the display device 100. In the case where the display device 100 can perform digital display, the image processing circuit 300 may directly supply the correction data of an image signal supplied to an image signal line to each image signal line 109 via the electrode terminal 114 of the display device 100 without passing through the DA conversion circuit 360.

The image processing circuit 300 feeding back correction data of an image signal to the display device 100 by measuring the capacitance value of wiring when the pixel region 106 is stretched or contracted was explained. The image processing circuit 300 not only feeds back correction data of an image signal to the display device 100 according to the contraction of the display device 100 but also changes the frequency of a signal for controlling a transistor included in a pixel 108, for example, changes the frequency of a clock signal supplied to the scanning signal line driving circuit 118.

As described above, even when the display device 200 is deformed, it is possible to supply correction data of an image to the display device 200 by measuring the capacitance value of a scanning signal line 110 and first intermediate wiring 210 at the time of deformation. Therefore, in the display device 200 having elasticity, it is possible to provide a display device which can detect stretching and contraction of the device by a change in capacitance. In addition, by detecting a capacitance value and sending correction data of an image signal to the display device 200, it is possible to solve problems such as distortion of an image. Furthermore, by changing a signal such as a clock frequency according to the contraction of the display device 200, it is possible to suppress deterioration in display quality.

(Third Embodiment)

In the present embodiment, the structure of a display device having elasticity related to one embodiment of the present invention is explained. Furthermore, an explanation related to a structure the same as that in the first embodiment and the second embodiment may be omitted.

Figure 4A:
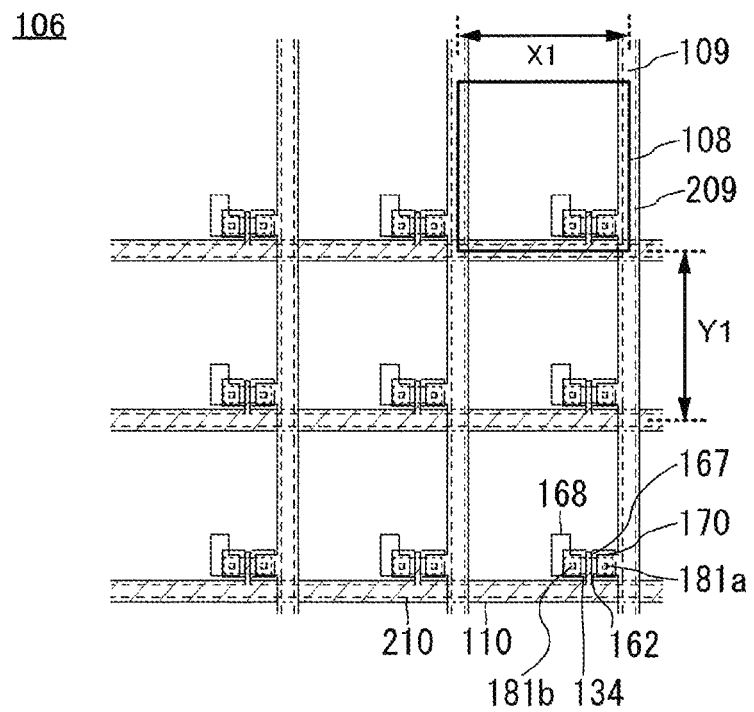
FIG. 4A is a schematic planar view diagram of a pixel region included in a display device related to one embodiment of the present invention.
Figure 4B:
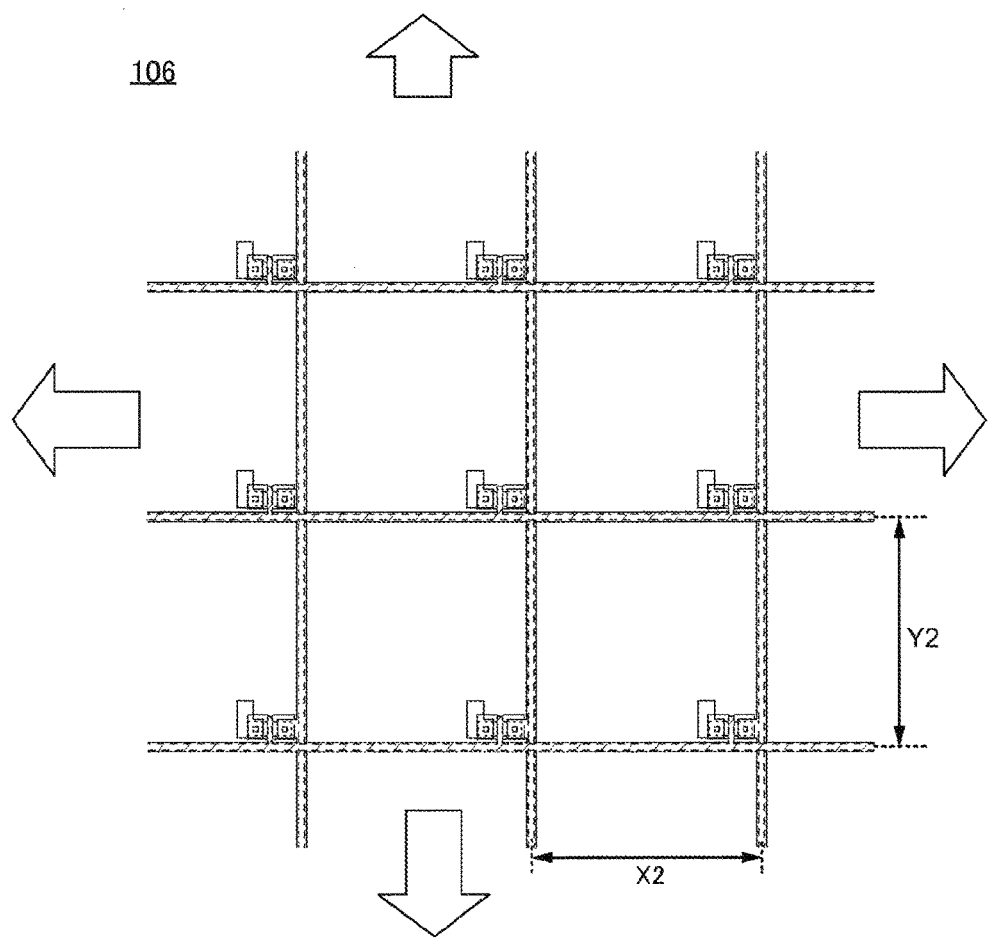
FIG. 4B is a schematic planar view diagram of a pixel region included in a display device related to one embodiment of the present invention.

FIG. 4A and FIG. 4B are schematic planar diagrams of 3 rows and 3 columns of the pixel region 106 included in the display device 100 shown in FIG. 1A, FIG. 1B, and FIG. 3. FIG. 4A shows the pixel region 106 of the display device in a standard state. FIG. 4B shows the pixel region 106 of the display device in a state stretched vertically in the X direction and horizontally in the Y direction. In FIG. 4A and FIG. 4B, the shape of wiring is a straight line shape.

Figure 5A:
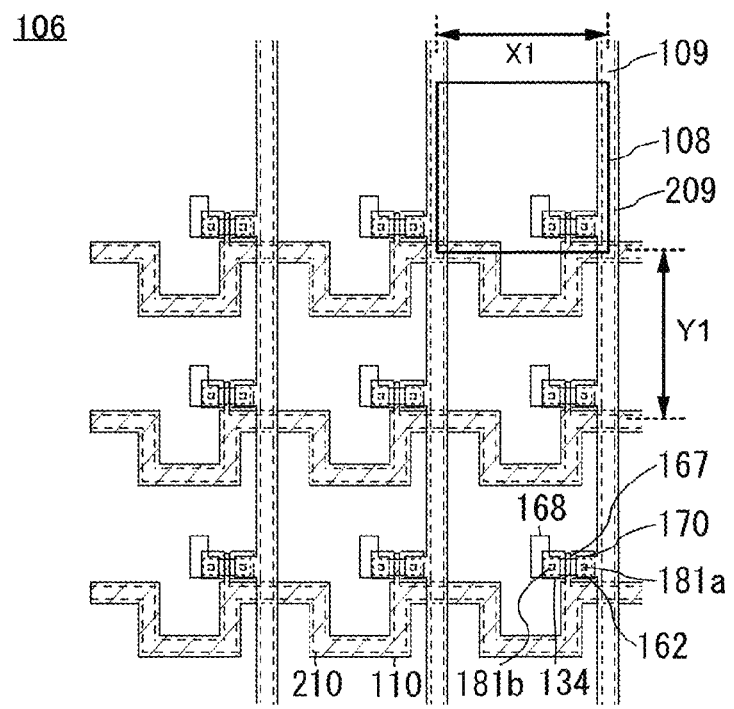
FIG. 5A is a schematic planar view diagram of a pixel region included in a display device related to one embodiment of the present invention.
Figure 5B:
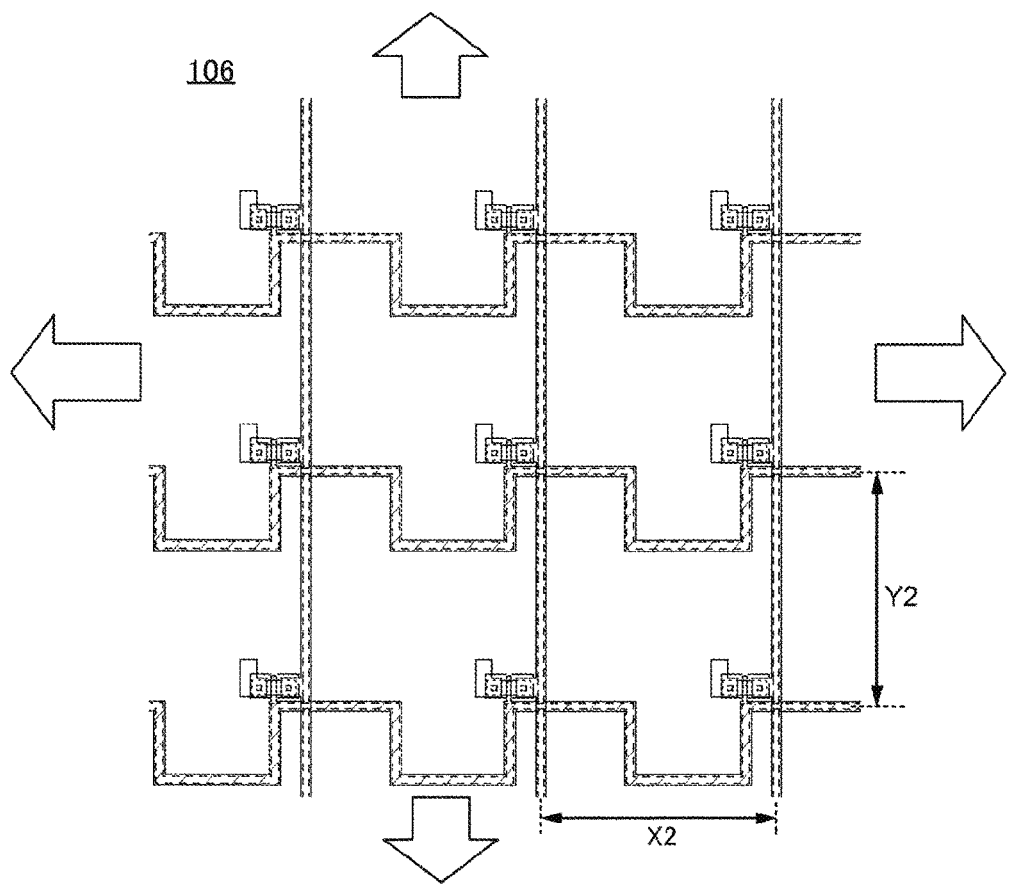
FIG. 5B is a schematic planar view diagram of a pixel region included in a display device related to one embodiment of the present invention.

FIG. 5A and FIG. 5B are schematic planar diagrams of 3 rows and 3 columns of the pixel region 106 included in the display device 100 shown in FIG. 1A, FIG. 1B and FIG. 3. FIG. 5A shows the pixel region 106 of the display device 100 in a standard state. FIG. 5B shows the pixel region 106 of the display device 100 in a state stretched vertically in the X direction and horizontally in the Y direction. In FIG. 5A and FIG. 5B, the shape of wiring is rectangular.

In FIG. 5A and FIG. 5B, the scanning signal line 110 and the first intermediate wiring 210 region are arranged overlapping each other and the image signal line 109 and the second intermediate wiring 209 region are arranged overlapping each other. The scanning signal line 110 and the first intermediate wiring 210 may also be arranged in parallel and the image signal line 109 and the second intermediate wiring 209 may also be arranged in parallel. Furthermore, the scanning signal line 110 and the first intermediate wiring 210 may be arranged overlapping each other and the image signal line 109 and the second intermediate wiring 209 may also be arranged in parallel. The scanning signal line 110 and the first intermediate wiring 210 may also be arranged in parallel and the image signal line 109 and the second intermediate wiring 209 may also be arranged overlapping each other.

A pixel 108 includes a transistor 134. In FIG. 4A, FIG. 4B, FIG. 5A and FIG. 5B, for the purpose of promoting understanding, the pixel circuit is shown with only the transistor 134. The pixel circuit includes a plurality of transistors and capacitors.

The transistor 134 included in a pixel 108 includes a semiconductor film 162, a gate electrode 167, a source or drain electrode 168 and a source or drain electrode 170. The source or drain electrode 168 and the source or drain electrode 170 are electrically connected to the source or drain region of a semiconductor film 162a via openings 181b and 181a respectively. The source or drain electrode 170 is electrically connected to an image signal line 109. The first intermediate wiring 210 is arranged in a layer further above the scanning signal line 110, and the first intermediate wiring 210 is arranged overlapping the scanning signal line 110. A width of the first intermediate wiring 210 is narrower than the line width of the scanning signal line 110. The second intermediate wiring 209 is arranged in a layer further above the image signal line 109, and the second intermediate wiring 209 is arranged overlapping the image signal line 109. The width of the second intermediate wiring 209 is narrower than the line width of the video signal line 109. It is possible to sufficiently secure a margin where the first intermediate wiring 210 overlaps with the scanning signal line 110 and the second intermediate wiring 209 overlaps with the image signal line 109, and a capacitance value can be accurately detected.

Figure 6:
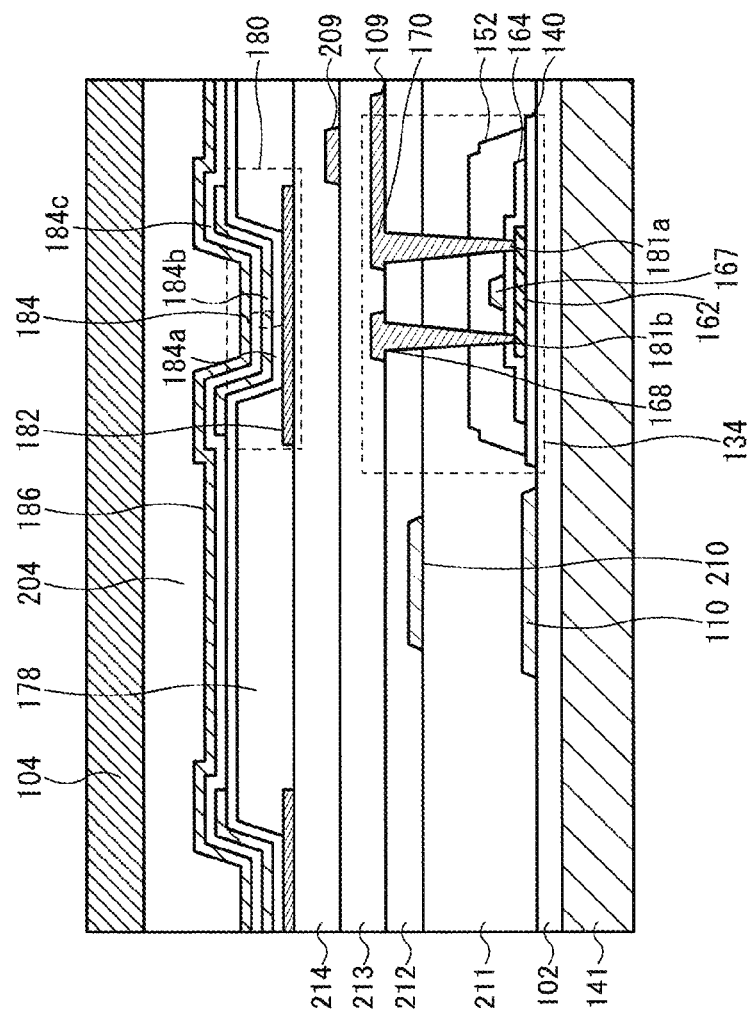
FIG. 6 is a schematic cross-sectional diagram of a display device related to one embodiment of the present invention.

FIG. 6 is a schematic cross-sectional diagram of a pixel 108 included in the pixel region 106. The display device 100 is explained using an EL display device as an example.

A stacked structure is explained. The pixel 108 includes a transistor 134 on the upper surface of the flexible substrate 102 via an underlying film 140 which has an arbitrary structure. The transistor 134 includes a semiconductor film 162, a gate insulating film 164, a gate electrode 167, a source or drain electrode 168, and a source or drain electrode 170. A region of the semiconductor film 162 overlapping the gate electrode 167 is a channel region and this channel region is sandwiched between a pair of source or drain regions. The source or drain electrode 168 and the source or drain electrode 170 are electrically connected to the source/drain region via the openings 181a and 181b arranged in an interlayer film 152, the gate insulating film 164, a first insulating film 211 and a second insulating film 212. The source or drain electrode 170 is electrically connected to an image signal line 109. The gate electrode 167 is electrically connected to a scanning signal line 110. The transistor 134 is arranged in a non-elastic region.

The non-elastic region is a region where a base film 140, the gate insulating film 164, and the interlayer film 152 region are arranged. An elastic region is outside a region where the pixel region 106 and the non-elastic region overlap.

There is no restriction to the structure of the transistor 134, and not only a so-called top gate type transistor as shown in FIG. 6 but also a bottom gate type transistor, a multi-gate type transistor having a plurality of gate electrodes 167, and a dual0gate transistor having gate electrodes 167 above and below the semiconductor film 162 may also be used. There is also no restriction to the vertical relationship between the semiconductor film 162 and the source or drain electrode 168.

The ends of the base film 140, the gate insulating film 164, and the interlayer film 152 are each tapered and the interlayer film 152 is covered by the first insulating film 211.

The base film 140 has a function for preventing the diffusion of impurities from the substrate 102 and is formed by a CVD method or the like using an inorganic compound such as silicon oxide, silicon nitride oxide, silicon oxynitride and silicon nitride or the like. The gate insulating film 164 can be formed by appropriately combining the materials used for the base film 140. The formation method can also be selected from a method applicable in the formation of the base film 140. The interlayer film 152 can be formed in a single layer or a stacked structure by appropriately combining the materials used for the base film 140 and the gate insulating film 164. For example, a stacked structure of silicon nitride and silicon oxide can be adopted. The formation method can also be selected from a method applicable for forming the base film 140.

It is possible to prevent a film including an inorganic compound from being damaged by arranging the base film 140 using an inorganic compound, the gate insulating film 164, and the end part of the interlayer film 152 in the non-elastic region. It is possible to easily stretch and contract compared with the case where a film including an inorganic compound exists on the entire surface of the display device 100 or the pixel region 106. Therefore, a highly reliable display device can be provided.

The scanning signal line 110 in an elastic region is arranged on the outer side of a region where the base film 140, the gate insulating film 164, and the interlayer film 152 region are arranged. The scanning signal line 110 in the elastic region is covered with by first insulating film. The first intermediate wiring 210 is formed between the first insulating film 211 and the second insulating film 212, and is covered by a second insulating film. The width of the first intermediate wiring 210 is narrower than the width of the scanning signal line 110. It is possible to secure a sufficient margin for the first intermediate wiring 210 overlapping with the scanning signal line 110 and a capacitance value can be accurately detected.

The source or drain electrodes 168 and 170 are covered by a third insulating film 213. The second intermediate wiring 209 is formed between the third insulating film 213 and a fourth insulating film 214 and is covered by the third insulating film. The width of the second intermediate wiring 209 is thinner than the width of an image signal line 210. It is possible to secure a sufficient margin for the second intermediate wiring 209 overlapping with an image signal line 210 and a capacitance value can be accurately detected.

The first insulating film, the second insulating film, the third insulating film and the fourth insulating film are formed from a material having elasticity. For example, a polymer material such as polyimide, polyamide, polyester, polycarbonate, or a precursor thereof can be used. Alternatively, a resin containing at least one of silicone rubber, fluorine rubber, nitrile rubber, acrylic rubber, butyl rubber, chloroprene rubber, styrene rubber, ethylene propylene rubber and the like may be used. A film can be flattened by using such a material. That is, since it is possible to cover a pattern having a concave convex form such as wiring and flatten the surface, defects such as cracks generated from the concave convex form can be suppressed. In addition, by forming the first insulating film, the second insulating film, the third insulating film and the fourth insulating film from a material having elasticity, the display device 100 or the pixel region 106 can easily be stretched and contracted. Therefore, a highly reliable display device can be provided.

A first electrode 182 is arranged on the upper surface of the fourth insulating film. A light emitting element 180 is formed from a first electrode 182, a second electrode 186 and an EL layer 184 arranged therebetween. The EL layer 184 is formed to cover the first electrode 182 and a partition wall 178, and the second electrode 186 is arranged thereon. Carriers (electrons, holes) are injected into the EL layer 184 from the first electrode 182 and the second electrode 186, and carrier recombination occurs in the EL layer 184. In this way, the excited state of an organic compound contained in the EL layer 184 is formed and the energy released when the excited state relaxes to a ground state is utilized as light emission. Therefore, a region where the EL layer 184 and the first electrode 182 contact is a light emitting region.

Although an example in which the EL layer has three layers (184a, 184b, 184c) is shown in FIG. 6, the layer structure of the EL layer is not limited and four or more layers may be stacked. For example, the light emitting element 180 can be formed by appropriately stacking various functional layers such as a carrier injection layer, a carrier transport layer, a light emitting layer, a carrier blocking layer and an exciton blocking layer.

In FIG. 6, while EL layers 184a and 184c also extend to adjacent pixels 108, the layer 184b (light emitting layer for example) is selectively arranged only within one pixel 108. In this way, the structure of the EL layer 184 between adjacent pixels 108 may be different. Therefore, different light emitting colors can be provided between adjacent pixels 108 for example. Alternatively, the EL layer 184 having the same structure may be formed between adjacent pixels 108. In this case, for example, by forming a light emitting element capable of emitting white light with each pixel 108 and arranging color filters having different optical characteristics between adjacent pixels, it is possible to extract various colors from the pixels 108 and perform full color display.

A passivation film (protective film) 204 for protecting the light emitting element 180 is arranged above the light emitting element 180.

A barrier film 104 is arranged above the passivation film 204. The barrier film 104 protects the passivation film 204 and each element arranged below the passivation film 204.

The flexible substrate 102 may be protected by the barrier film 141. The barrier film 141 may be a film including an inorganic compound. A barrier film prevents the entrance of moisture or the like into the display device 100. Therefore, it is possible to provide a highly reliable display device. In addition, a flexible material may be used for the flexible substrate 102, and for example, a polymer material such as polyimide, polyamide, polyester, polycarbonate or a precursor thereof can also be used. Glass fine particles or fibers may be mixed with these materials. Alternatively, a resin including at least one of silicone rubber, fluorine rubber, nitrile rubber, acrylic rubber, butyl rubber, chloroprene rubber, styrene rubber, ethylene propylene rubber and the like can also be used.

The same as the barrier film 141, the barrier film 104 may be a film containing an inorganic compound and moisture or the like can be prevented from entering the display device 100. Therefore, a highly reliable display device can be provided.

By adopting the above structure, even if the display device 100 is stretched or contracted, by measuring the capacitance values of the scanning signal line 110 and the first intermediate wiring 210 before and after stretching and contraction, and the capacitance value of the image signal line 109 and second intermediate wiring 209 before and after stretching and, it is possible to provide a display device capable of detecting the stretching and contraction using a change in the capacitance. In addition, by arranging an inorganic compound such as a gate insulating film, a transistor or the like in a non-elastic region, it becomes more difficult for the non-elastic region to deform as compared with tan elastic region. That is, the transistor can be protected. On the other hand, by arranging polyimide or the like in the elastic region, the elastic region can be easily stretched and contracted compared with the non-elastic region. Therefore, it is easy to stretch and contract a region to be stretched and contracted and it is possible to realize a structure that is difficult to stretch and contract in a region to be protected. Therefore, a highly reliable display device can be provided.

Figure 7A:
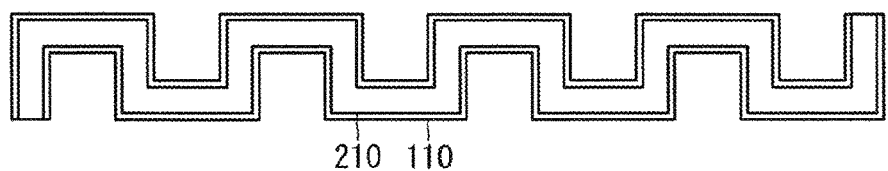
FIG. 7A is a schematic planar view diagram for explaining the shape of wiring included in a display device related to one embodiment of the present invention.
Figure 7B:
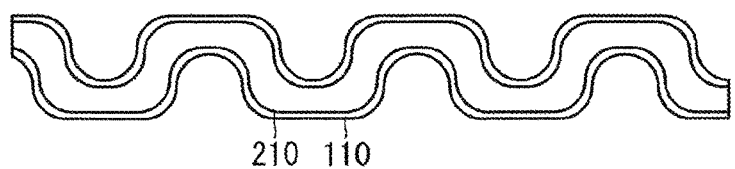
FIG. 7B is a schematic planar view diagram for explaining the shape of wiring included in a display device related to one embodiment of the present invention.
Figure 7C:
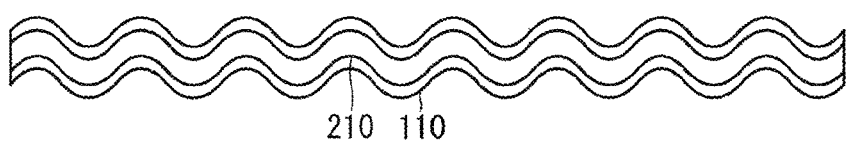
FIG. 7C is a schematic planar view diagram for explaining the shape of wiring included in a display device related to one embodiment of the present invention.
Figure 7D:
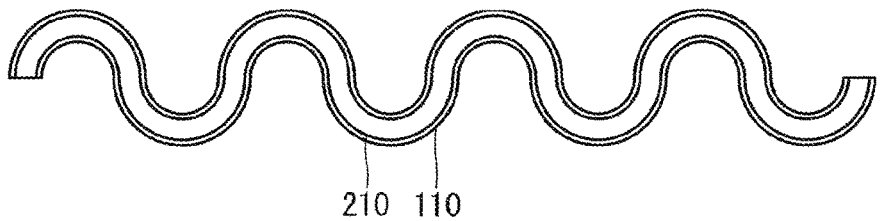
FIG. 7D is a schematic planar view diagram for explaining the shape of wiring included in a display device related to one embodiment of the present invention.

FIG. 7A to FIG. 7F show examples of shapes of wirings used for the scanning signal line 110 and the first intermediate wiring 210. FIG. 7A, FIG. 7B, FIG. 7C, and FIG. 7D show examples of wiring shapes having elasticity. The same is used for the image signal line 109 and the second intermediate wiring 209. Furthermore, the wiring shape is not limited to the shapes in FIG. 7A to FIG. 7F. In FIG. 4A and FIG. 4B, an example in which the shape of stretchable wiring is a rectangle (FIG. 7A) is shown. The shape of the wiring may be a shape with a rectangular corner (FIG. 7B), a wave shape (FIG. 7C) or a shape in which semicircles are linked (FIG. 7D). The wiring shape is suitable for wiring used in a display device having elasticity since any of the wiring shapes can be easily deformed when stretched and contracted with excellent elasticity compared with a straight line shape.

Figure 7E:
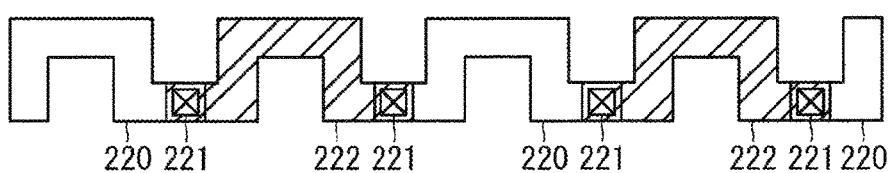
FIG. 7E is a schematic planar view diagram for explaining the shape of wiring included in a display device related to one embodiment of the present invention.
Figure 7F:
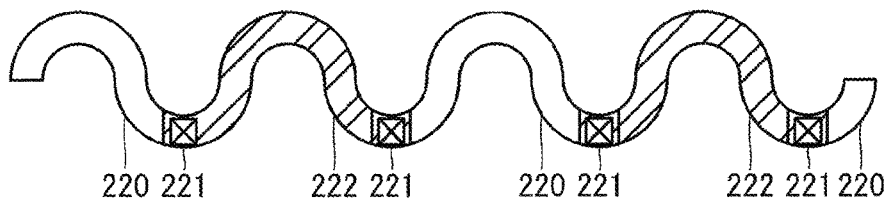
FIG. 7F is a schematic planar view diagram for explaining the shape of wiring included in a display device related to one embodiment of the present invention.

FIG. 7E and FIG. 7F show an example of the shape of wiring including a part 220 having elasticity and a part 222 having non-elasticity. The part 220 having elasticity and the part 222 having non-elasticity are electrically connected via a second opening 221. The wiring shape is not limited to the shape shown in FIG. 7A to 7F. In addition, the shapes of the part 220 having elasticity and the part 222 having non-elasticity are shown as a rectangular shape (FIG. 7E) and a shape in which semicircles are linked (FIG. 7F). In addition, for example, although only the scanning signal line 110 is shown, the first intermediate wiring 210 may have the same shape and may be overlapped with the scanning signal line 110. The same applies to the image signal line 109 and the second intermediate line 209.

The scanning signal line 110, the first intermediate line 210, the image signal line 109, the second intermediate line 209, the gate electrode 167, the source or drain electrode 168 and the source or drain electrode 170 may have a part having elasticity or the entirety of these elements may have elasticity. The scanning signal line 110, the first intermediate wiring 210, the image signal line 109, the second intermediate wiring 209, the gate electrode 167, the source or drain electrode 168 and the source or drain electrode 170 are formed of a conductive metal or a film formed using a conductive material including metal powder having conductivity and a resin. For example, the conductive metal or metal powder having conductivity includes at least one from among silver (Ag), gold (Au), platinum (Pt), palladium (Pd), copper (Cu), nickel (Ni) and aluminum (Al). In addition, the resin includes at least one of silicone rubber, fluororubber, nitrile rubber, acrylic rubber, butyl rubber, chloroprene rubber, styrene rubber, ethylene propylene rubber and the like. A conductive film having elasticity is formed by coating or printing.

In this way, it is possible to providing a part of or all of the scanning signal line 110, the first intermediate wiring 210, the image signal line 109, the second intermediate wiring 209, the gate electrode 167, the source or drain electrode 168 and the source or drain electrode 170 with elasticity. By providing each wiring with a part having elasticity, the part having elasticity is easy to stretch and contract, and it is possible to provide a display device having excellent flexibility and parts having non-elasticity other than the parts having elasticity have excellent rigidity. For example, parts having rigidity may be arranged with a region to be protected such as a transistor.

(Fourth Embodiment)

In the present embodiment, a structure different from that of the second embodiment is explained described in a display device related to one embodiment of the present invention, in particular, a display device having elasticity. Explanations related to structures similar to those of the first to third embodiments may be omitted. In the structure of the display device described in the present embodiment, wirings of two layers for detecting a capacitance value region arranged so as to be inverted with respect to the Y axis and overlap each other.

Figure 8A:
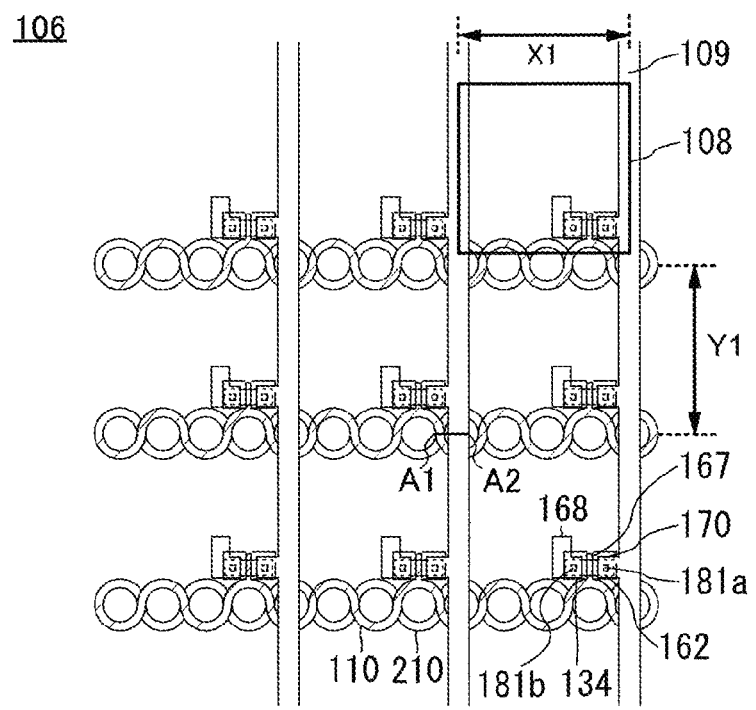
FIG. 8A is a schematic planar view diagram of a pixel region included in a display device related to one embodiment of the present invention.
Figure 8B:
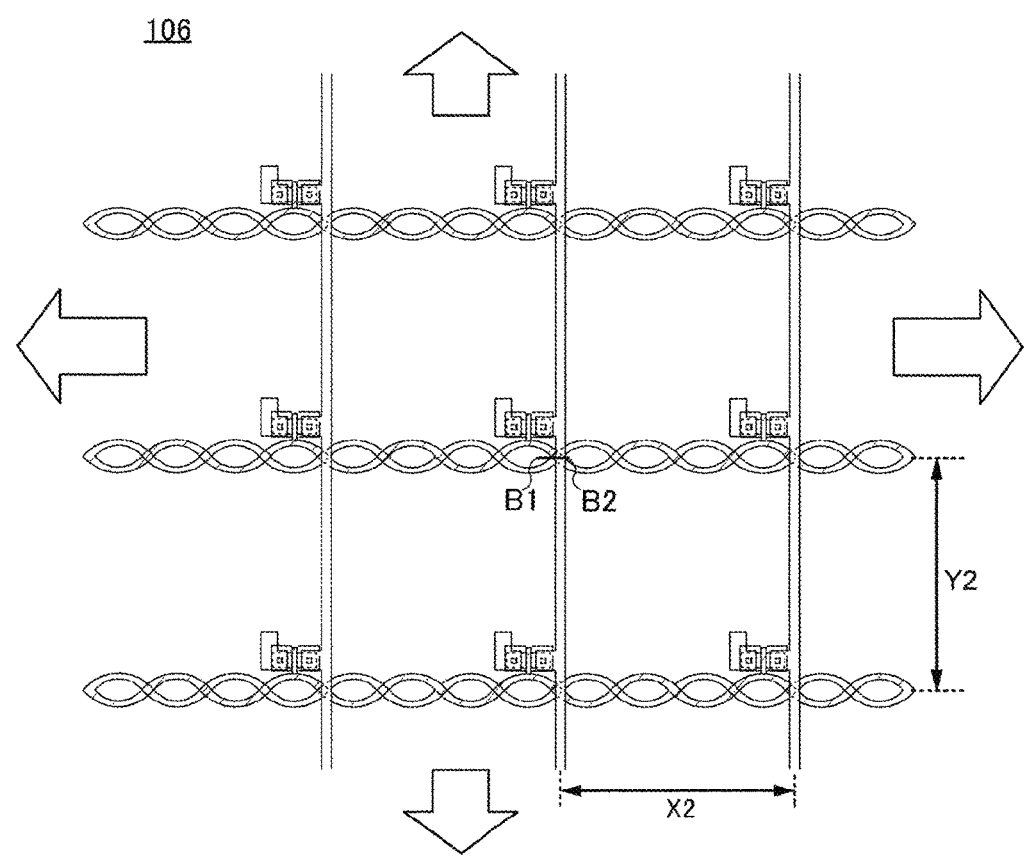
FIG. 8B is a schematic planar view diagram of a pixel region included in a display device related to one embodiment of the present invention.

FIG. 8A and FIG. 8B are schematic planar diagrams of 3 rows and 3 columns of the pixel region 106 included in the display device 100 shown in FIG. 1A, FIG. 1B, and FIG. 3. FIG. 8A shows the pixel region 106 of the display device 100 in a standard state. FIG. 8B shows a state in which the pixel region 106 of the display device 100 is extended vertically in the X direction and horizontally in the Y direction.

Figure 9A:
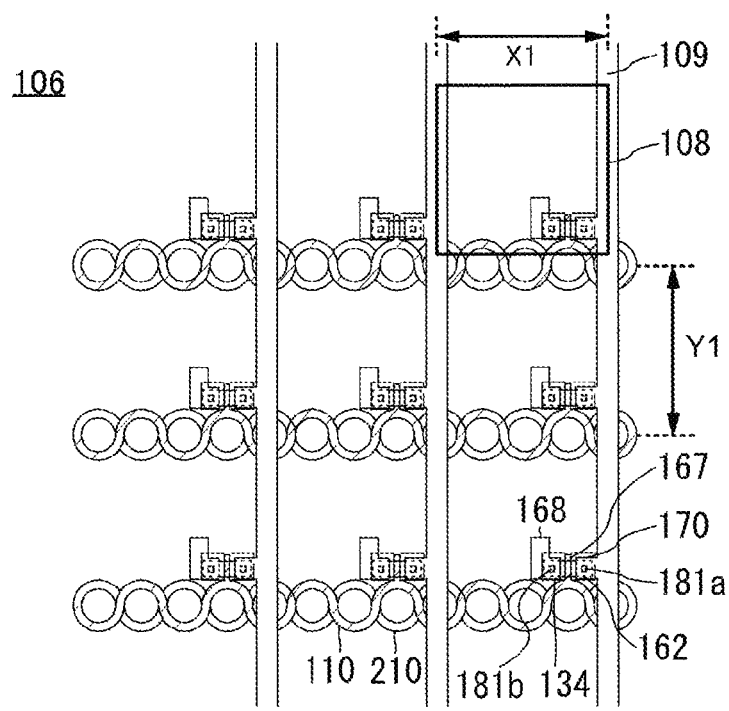
FIG. 9A is a schematic planar view diagram of a pixel region included in a display device related to one embodiment of the present invention.
Figure 9B:
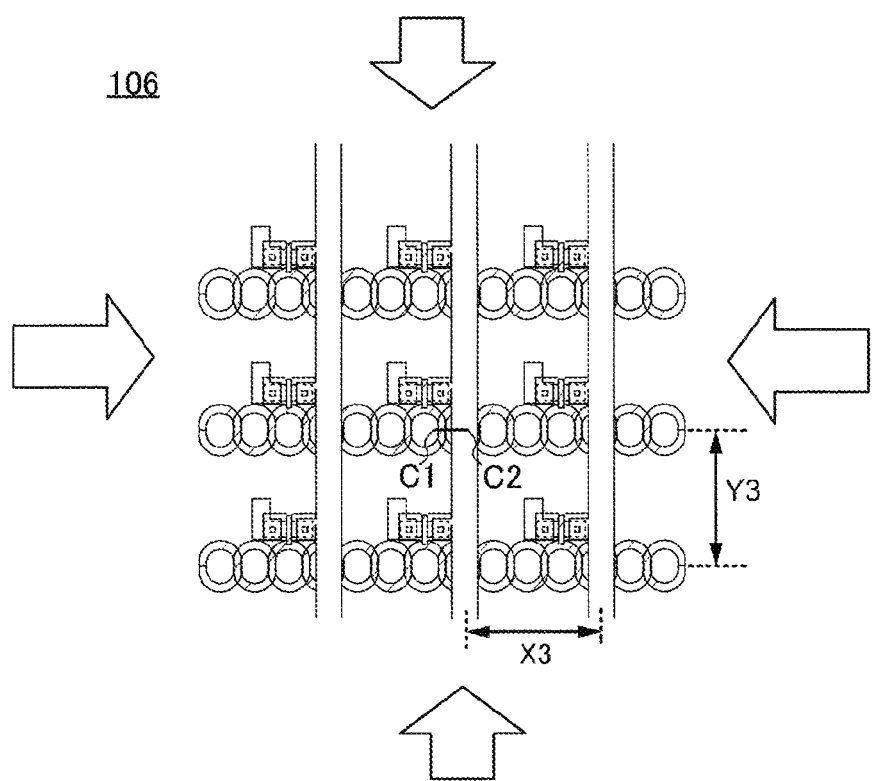
FIG. 9B is a schematic planar view diagram of a pixel region included in a display device related to one embodiment of the present invention.

FIG. 9A and FIG. 9B are schematic planar diagrams of 3 rows and 3 columns of the pixel region 106 included in the display device 100 shown in FIG. 1A, FIG. 1B, and FIG. 3. FIG. 9A shows the pixel region 106 of the display device 100 in a standard state the same as FIG. 8A. FIG. 9B shows a state in which the pixel region 106 of the display device 100 is contracted vertically in the X direction and horizontally in the Y direction.

The first intermediate wiring 210 is arranged above the scanning signal line 110. The shape of the first intermediate wiring 210 is the same as the shape of the scanning signal line 110. The first intermediate wiring 210 and the scanning signal line 110 are arranged so as to be inverted with respect to the Y axis and overlap each other.

Although the first intermediate wiring 210 and the scanning signal line 110 are described in FIG. 8A, FIG. 8B, FIG. 9A and FIG. 9B, the shape of the second intermediate wiring 209 may have the same structure as that of the image signal line 109. That is, the second intermediate wiring 209 may be arranged and the second intermediate wiring 209 and the image signal line 109 may be arranged so as to be inverted with respect to the Y axis and overlap each other.

Figure 10A:
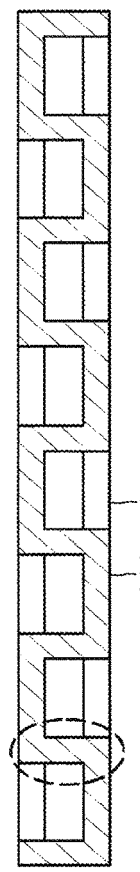
FIG. 10A is a schematic planar view diagram for explaining the shape of wiring included in a display device related to one embodiment of the present invention.
Figure 10B:
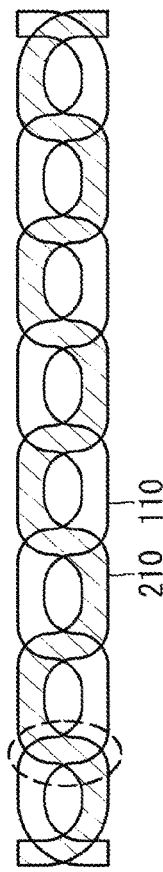
FIG. 10B is a schematic planar view diagram for explaining the shape of wiring included in a display device related to one embodiment of the present invention.
Figure 10C:
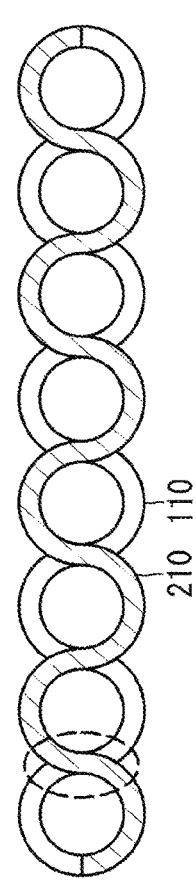
FIG. 10C is a schematic planar view diagram for explaining the shape of wiring included in a display device related to one embodiment of the present invention.
Figure 10D:
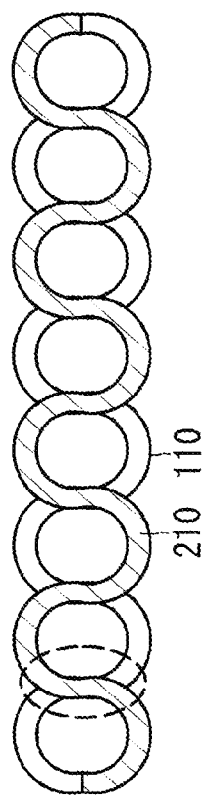
FIG. 10D is a schematic planar view diagram for explaining the shape of wiring included in a display device related to one embodiment of the present invention.
Figure 10E:
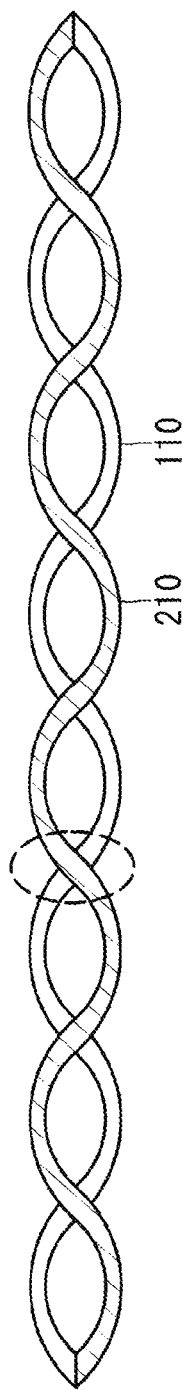
FIG. 10E is a schematic planar view diagram for explaining the shape of wiring included in a display device related to one embodiment of the present invention.

FIG. 10A to FIG. 10E show examples of shapes of elastic wirings used for the scanning signal line 110 and the first intermediate wiring 210. The same is used for the image signal line 109 and the second intermediate wiring 209. Furthermore, the wiring shape is not limited to the shape shown in FIG. 10A to FIG. 10E. An example is shown in FIG. 9A and FIG. 9B in which the shape of elastic wiring is a shape in which semicircles are linked (FIG. 10C). FIG. 10D shows a state in which FIG. 10C is contracted. In FIG. 10D, the overlapping region (within the dotted line in the diagram) between the scanning signal line 110 and the first intermediate wiring 210 is larger than that in FIG. 10C. FIG. 10E shows a state where FIG. 10C is stretched. In FIG. 10D, the overlapping region (within the dotted line in the diagram) of the scanning signal line 110 and the first intermediate wiring 210 is smaller than that in FIG. 10C. The shape of wiring may be a rectangle (FIG. 10A) or a shape having rectangular corners (FIG. 10B). The wiring shape is suitable for wiring used in a display device having elasticity since any of the wiring shapes can be easily deformed when stretched and contracted with excellent elasticity compared with a straight line shape.

Figure 11A:
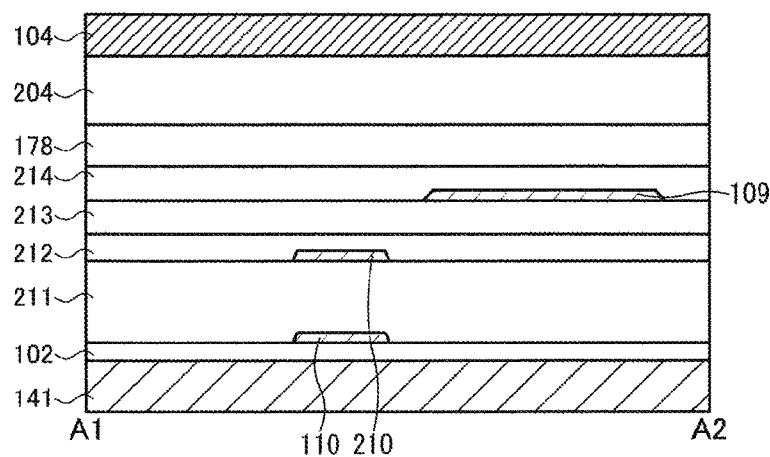
FIG. 11A is a schematic cross-sectional diagram of wiring included in a display device related to one embodiment of the present invention.
Figure 11B:
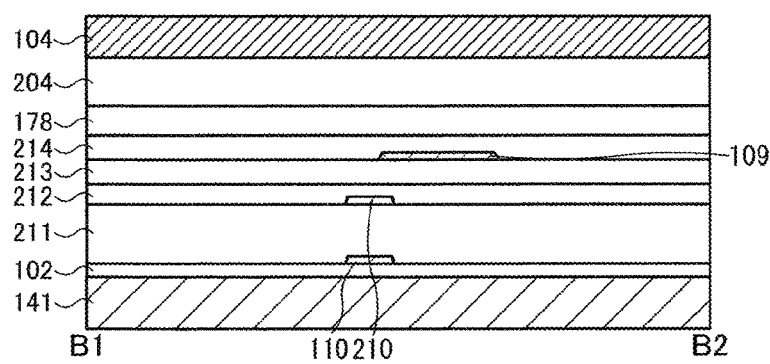
FIG. 11B is a schematic cross-sectional diagram of wiring included in a display device related to one embodiment of the present invention.
Figure 11C:
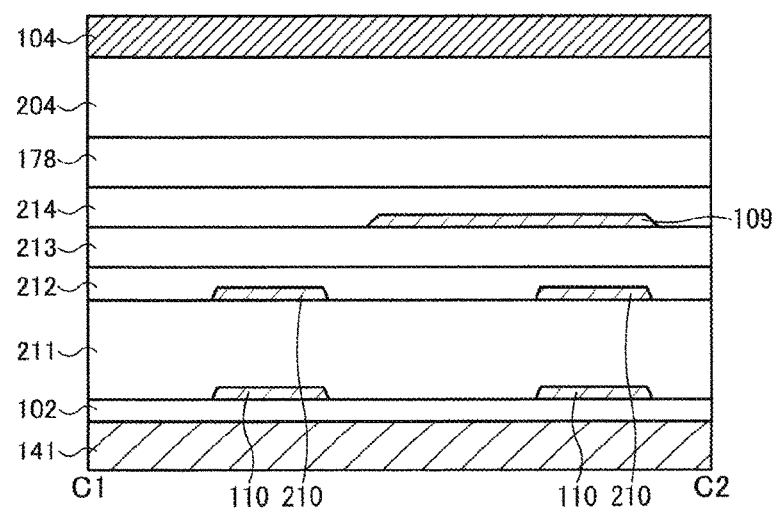
FIG. 11C is a schematic cross-sectional diagram of wiring included in a display device related to one embodiment of the present invention.

FIG. 11A to FIG. 11C show cross-sections of the schematic planar views shown in FIG. 8A, FIG. 8B and FIG. 9B, respectively. FIG. 11A shows a schematic cross-section of A1-A2 in which the pixel region 106 of the display device 100 shown in FIG. 8A is in the standard state in. FIG. 11B shows a schematic cross-section of B1-B2 in which the pixel region 106 of the display device 100 shown in FIG. 8B is in a stretched state. FIG. 11C shows a schematic cross-section of C1-C2 in which the pixel region 106 of the display device 100 shown in FIG. 9B is in a contracted state.

By forming the pixel region 106 of the display device 100 as shown in FIG. 8A to FIG. 9B, it is possible to maintain the products of the resistance value and the capacitance value of wiring constant. In the stretched state of the pixel region 106 of the display device 100 (FIG. 8B), the length of the scanning signal line 110 is longer than that of the pixel region 106 in the standard state (FIG. 8A), and the resistance value becomes larger (FIG. 8B). In addition, in the stretched state of the pixel region 106 of the display device 100 (FIG. 8B), the overlapping region between the scanning signal line 110 and the first intermediate wiring 210 becomes larger, and the capacitance value of a capacitance formed by the first insulating film becomes smaller between the scanning signal line 110 and the first intermediate wiring 210. Therefore, in the stretched state of the pixel region 106 of the display device 100 (FIG. 8B), the products of the resistance value and its capacitance value is made constant. In addition, in the contracted state of the pixel region 106 of the display device 100 (FIG. 9B), the length of the scanning signal line 110 is shorter than that compared to when the pixel region 106 is in the standard state (FIG. 9A). In addition, in the contracted state of the pixel region 106 of the display device 100 (FIG. 9B), the resistance value of the scanning signal line 110 becomes sale and the overlapping region of the scanning signal line 110 and the first intermediate wiring 210 becomes smaller (FIG. 9B). Furthermore, in the contracted state of the pixel region 106 of the display device 100 (FIG. 9B), the capacitance value of a capacitance formed by the first insulating film between the scanning signal line 110 and the first intermediate wiring 210 becomes larger. Therefore, in the contracted state of the pixel region 106 of the display device 100 (FIG. 9B), the products of its resistance value and its capacitance value is made constant. Furthermore, inductance may also be taken into consideration in addition to the resistance value and the capacitance value.

By adopting the structure as described above, the display device 100 can balance a resistance value of wiring and a capacitance value between wirings when it is stretched or contracted. That is, even if the display device 100 is stretched or contracted, since the products of the wiring resistance value and the wiring capacitance value can be kept constant, or the impedance can be kept constant, even if the display device 100 is stretched or contracted, it is possible to prevent a signal from being delayed or from becoming faster within the display device.

(Fifth Embodiment)

In the present embodiment, a display device capable of detecting elasticity by a change in resistance in a display device related to one embodiment of the present invention, in particular, a display device having elasticity is explained. Explanations related to structures similar to those of the first to fourth embodiments may be omitted.

Figure 12A:
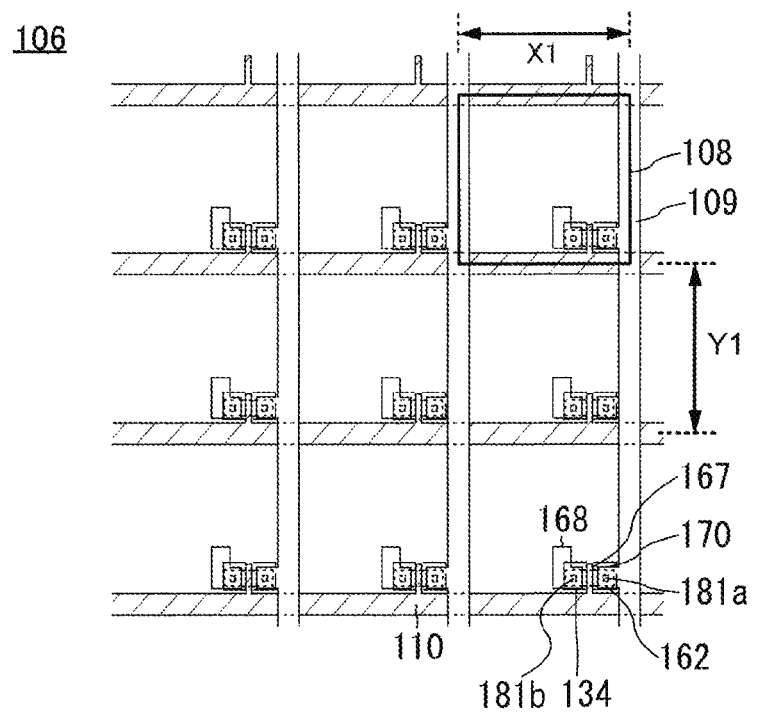
FIG. 12A is a schematic planar view diagram of a pixel region included in a display device related to one embodiment of the present invention.
Figure 12B:
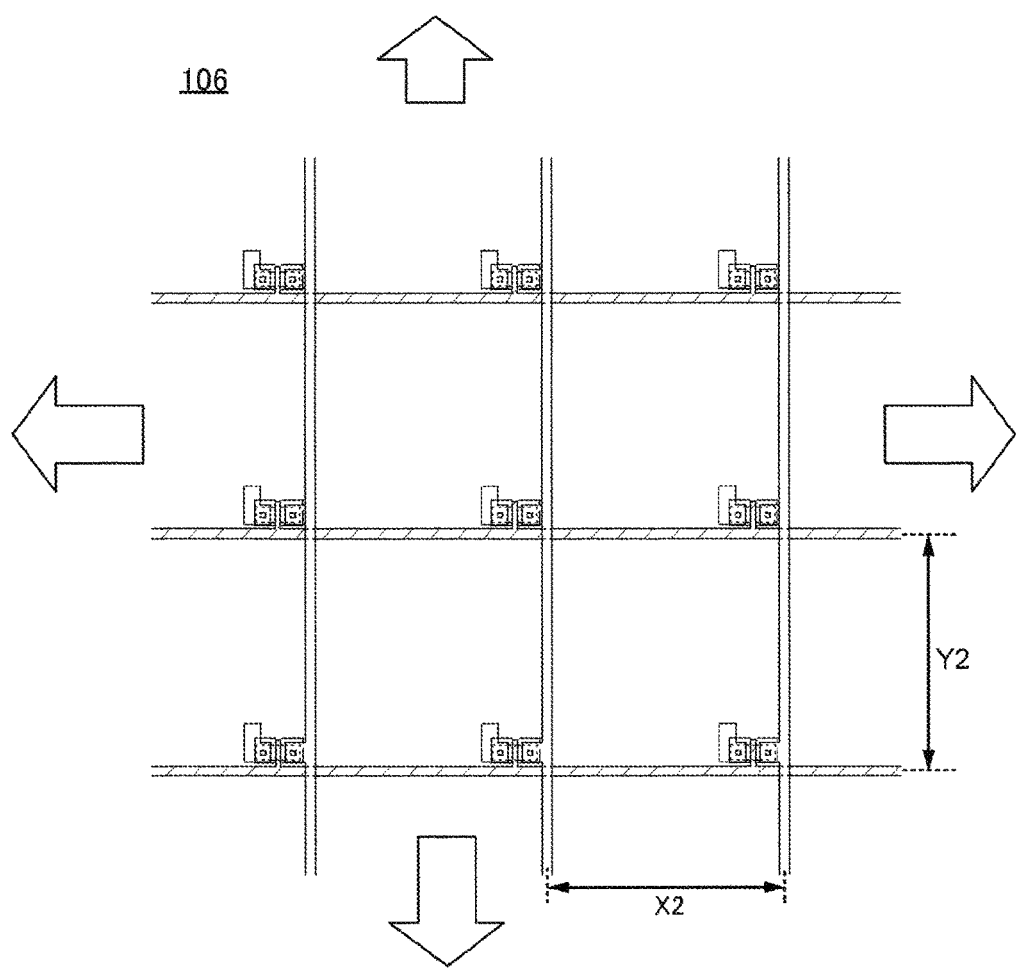
FIG. 12B is a schematic planar view diagram of a pixel region included in a display device related to one embodiment of the present invention.

FIG. 12A and FIG. 12B are schematic planar diagrams of the pixel region 106 included in the display device related to one embodiment of the present invention.

In the pixel region 106, a plurality of pixels 108 are arranged along a first direction and a second direction intersecting the first direction. The number of the plurality of pixels 108 may be arbitrarily set. For example, m pixels 108 are arranged in the X direction and n pixels 108 are arranged in the Y direction. The code m and n are each independently a natural number larger than 1. In FIG. 12A and FIG. 12B, an example is shown in which the arrangement of a plurality of pixels 108 is 3 rows and 3 columns. In the pixel region 106, the plurality of image signal lines 109 extend in parallel in the Y direction, and the plurality of scanning signal lines 110 extend in parallel in the X direction. Each pixel 108 is arranged with a pixel circuit. In FIG. 12A and FIG. 12B, for the purpose of promoting understanding, only the transistor 134 is shown in the pixel circuit. The pixel circuit includes a plurality of transistors and a capacitor.

The plurality of image signal lines 109 and the plurality of scanning signal lines 110 are wirings formed using a material having elasticity.

FIG. 12A shows the pixel region 106 of the display device 100 in a standard state. FIG. 12B shows a state in which the pixel region 106 of the display device 100 is stretched vertically in the X direction and horizontally in the Y direction. Since the plurality of image signal lines 109 and the plurality of scanning signal lines 110 are wirings formed using a material having elasticity, it can be seen that the wiring is stretched and narrow.

Detection of stretching or contraction of wiring is performed in the following procedure. A resistance value of a scanning signal line 110 is measured when the pixel region 106 of the display device is in a standard state (FIG. 12A). Next, a resistance value of the scanning signal line 110 is measured when the pixel region 106 of the display device is in a stretched state (FIG. 12B). The two resistance values are compared. Next, a resistance value of an image signal line 109 is measured when the pixel region 106 of the display device is in a standard state (FIG. 12A). Next, a resistance value of an image signal line 109 is measured when the pixel region 106 of the display device is in a stretched state (FIG. 12B). The two resistance values are compared. The scanning signal line 110 and the image signal line 109 are narrow in width and long in length when the pixel region 106 of the display device 100 is in a stretched state (FIG. 12B). Therefore, the resistance values of the scanning signal line 110 and the video signal line 109 when the pixel region 106 of the display device 100 is in a stretched state (FIG. 12B) are larger than the resistance values of the scanning signal line 110 and the video signal line 109 of the display device 100 when the pixel region 106 of the display device 100 is in a standard state (FIG. 12A). In this way, it is possible to detect stretching and contraction of the wiring in the X direction and the Y direction. It can be seen that the pixel region 106 of the display device is enlarged in the X direction and the Y direction.

In FIG. 12A and FIG. 12B, the detection of stretching and contraction of wiring when the pixel region 106 of the display device is in a stretched state was explained. The detection of the wiring when the pixel region 106 of the display device is in a contracted state is the same. When the pixel region 106 of the display device 100 is in a contracted state, the scanning signal line 110 and the image signal line 109 are wide in width and short in length. Therefore, the resistance values of the scanning signal line 110 and the video signal line 109 when the pixel region 106 of the display device 100 is in a contracted state are smaller than the resistance values of the scanning signal line 110 and the image signal line 109 when the pixel region 106 of the display device 100 is in a standard state (FIG. 12A). In this way, it is possible to detect stretching and contraction of the wiring. In addition, it can be seen that the pixel region 106 of the display device 100 is contracted in the X direction and the Y direction.

The detection of stretching and contraction of wiring when the pixel region 106 of the display device is in a stretched or contracted state was explained above. Furthermore, it is possible to detect elasticity of the display device by measuring the resistance value of the scanning signal line 110 and the image signal line 109 when the X direction is stretched and the Y direction is contracted. In addition, it is possible to detect elasticity of the display device by measuring the resistance value of the scanning signal line 110 and the image signal line 109 when the X direction is contracted and the Y direction is stretched.

Measurement of a resistance value of wiring may be performed by a two-terminal method or four terminals. For example, the two-terminal method is explained. In the measurement of a resistance value of wiring, a current value is measured by providing a voltage potential difference to the two terminals of the wiring to be measured. The resistance value is calculated from the voltage potential difference and the measured current value. Alternatively, a voltage potential difference is measured by supplying a current to two terminals of the wiring to be measured. The resistance value is calculated from the supplied current value and the measured voltage potential difference. In the measurement of the resistance value of the wiring, a transistor electrically connected to the wiring to be measured conducts which makes a change in display possible. Therefore, the voltage potential difference is a voltage potential difference where the transistor does not change, specifically, a voltage potential difference equal to or lower than the threshold voltage of the transistor. Alternatively, the current provides a current value so that a voltage equal to or lower than the threshold voltage of the transistor can be detected. In this way, it is possible to measure the resistance value of the wiring.

For example, measurement of a resistance value of wiring may be performed in a blank period between frames in which image signals are written. The (n−k1) th scanning signal line and the (m−k2) th image signal line for measuring the resistance value are determined in advance and each signal line may be extended to the terminal electrode 116. At this time, each signal line may be separated from the scanning signal line driving circuit 118 and the image signal line driving circuit 120 by a switch. Furthermore, measurement of the resistance value of the wiring does not have to be performed between the frame periods described above. In the case of dot sequential scanning, measurement may be performed in a horizontal flyback period between the (n−k1) scanning signal line and the (n−k1+1) th scanning signal line. If measurement is possible, it may be performed in any state. The code n and m are each independently natural numbers larger than 2. In addition, k1 and k2 are natural numbers larger than 1. Furthermore, n is larger than k1 and m is larger than k2.

Figure 13:
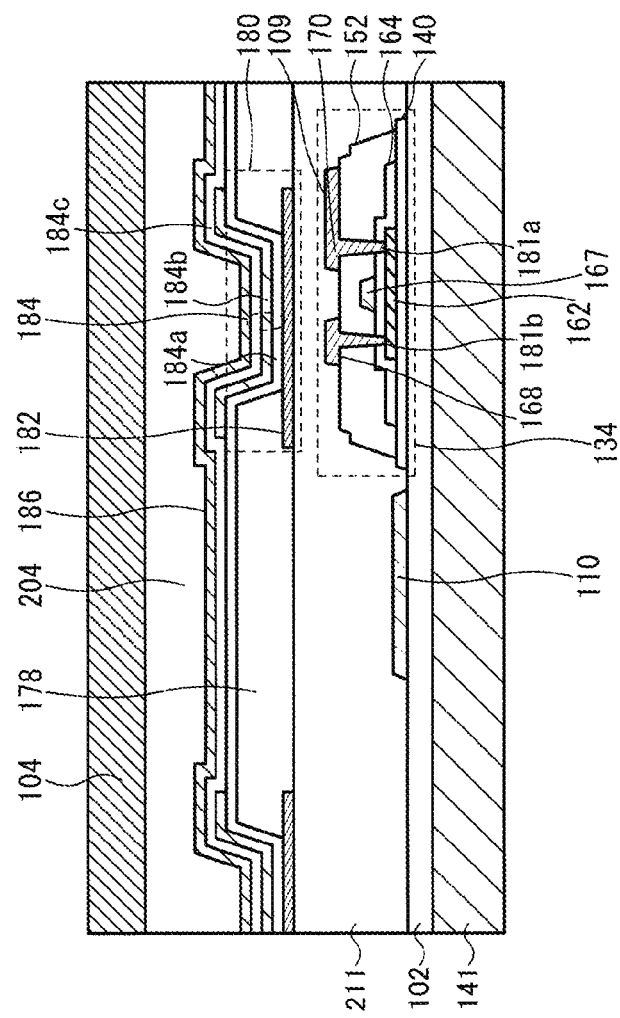
FIG. 13 is a schematic cross-sectional diagram of wiring included in a display device related to one embodiment of the present invention.
Figure 14A:
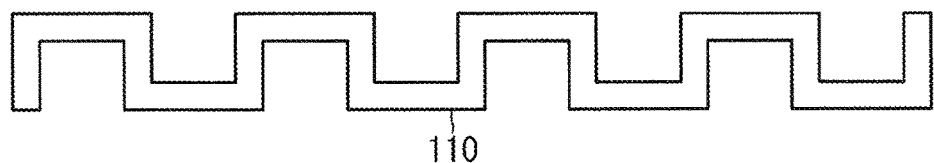
FIG. 14A is a schematic planar view diagram for explaining the shape of wiring included in a display device related to one embodiment of the present invention.
Figure 14B:
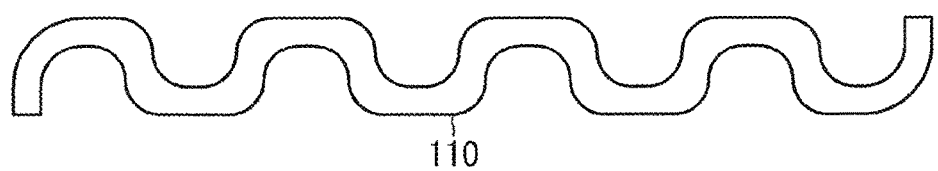
FIG. 14B is a schematic planar view diagram for explaining the shape of wiring included in a display device related to one embodiment of the present invention.
Figure 14C:
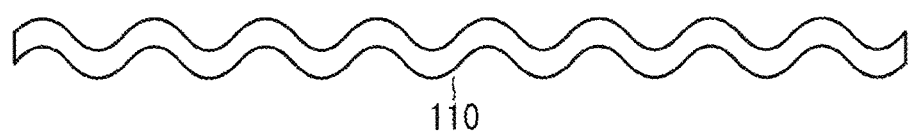
FIG. 14C is a schematic planar view diagram for explaining the shape of wiring included in a display device related to one embodiment of the present invention.
Figure 14D:
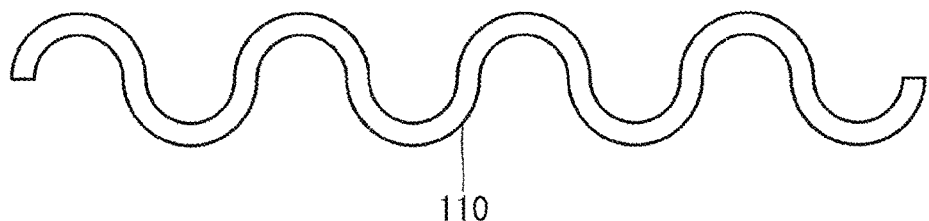
FIG. 14D is a schematic planar view diagram for explaining the shape of wiring included in a display device related to one embodiment of the present invention.

FIG. 13 is a schematic cross-sectional view of the pixel 108 included in the pixel region 106. An EL display device is used as an example of the display device 100. The cross-sectional view of FIG. 13 is a structure in which the second insulating film 212, the first intermediate wiring 210, the third insulating film 213, the second intermediate wiring 209 and the fourth insulating film 214 are not arranged in the cross-sectional view shown in FIG. 6.

The non-elastic region is a region where the base film 140, the gate insulating film 164 and the interlayer film 152 are arranged. The elastic region is outside the region where the pixel region 106 and the non-elastic region overlap. The transistor 134 is included in the non-elastic region.

FIG. 14A to FIG. 14D show examples of shapes of elastic wires used for the scanning signal line 110. The same is also used for the image signal line 109. Furthermore, the wiring shape is not limited to those shown in FIG. 14A to FIG. 14D. In FIG. 12A and FIG. 12B, an example is shown in which the shape of the elastic wiring is a straight line. The shape of the wiring may be a rectangle (FIG. 7A), a shape having rectangular corners (FIG. 7B), a wave shape (FIG. 7C), or a shape with linked semicircles (FIG. 7 D).

By adopting such a display device, it is possible to provide a display device having elasticity. A display device having elasticity can have a function capable of deforming a display region. A display device having elasticity can detect stretching and contraction of a display region.

Each embodiment described above as embodiments of the present invention can be implemented in combination as appropriate as long as they do not contradict each other. In addition, examples based on the display device of each embodiment, examples in which a person ordinarily skilled in the art appropriately adds, deletes or changes the design of constituent elements, or examples in which processes are added, omitted, or conditions are changed are also included in the scope of the present invention as long as they include the concept of the present invention.

Although a display device has mainly been exemplified as a disclosed example in the present specification, as another application example, other self-luminous type display devices, liquid crystal display devices, electronic paper type display devices having electrophoretic elements and the like, and any flat panel type display device can be used. In addition, the present invention can be applied from medium to small size to large sizes without any particular limitation.

It is properly understood that another effect different from that provided by the modes of the aforementioned embodiments is achieved by the present invention if the effect is obvious from the description in the specification or readily conceived by persons ordinarily skilled in the art.

What is claimed is:
1. A display device comprising:
a flexible substrate;
a plurality of pixels arranged in a first direction and a second direction intersecting the first direction;
a first wiring and a second wiring extending in the first direction; and
a first insulating film,
wherein
the first insulating film is included between the first wiring and the second wiring;
the second wiring overlaps the first wiring in a plan view;
the first wiring and the second wiring include a part having elasticity;
the first insulating film includes elasticity;
an interval between the first wiring and the second wiring changes as the flexible substrate stretches and contracts;
the first wiring and the second wiring form a first capacitor via the first insulating film; and
a capacitance value of the first capacitor changes as the flexible substrate stretches and contracts.

2. The display device according to claim 1, further comprising:
a plurality of pixels arranged in a third direction and a fourth direction intersecting the third direction;
a third wiring and a fourth wiring extending in the fourth direction; and
a second insulating film,
wherein
the second insulating film is included between the third wiring and the fourth wiring;
the third wiring and the fourth wiring include a part having elasticity;
the second insulating film includes elasticity; and
an interval between the third wiring and the fourth wiring changes as the flexible substrate stretches and contracts.

3. The display device according to claim 1, wherein the first wiring contacts the first insulating film, the first insulating film contacts the second wiring.

4. The display device according to claim 2, wherein the third wiring contacts the second insulating film, the second insulating film contacts the fourth wiring, the fourth wiring overlaps the third wiring, the second wiring and the fourth wiring form a second capacitor via the second insulating film, and a capacitance value of the second capacitor changes as the flexible substrate stretches and contracts.

5. The display device according to claim 1, wherein each of the plurality of pixels includes a transistor.

6. The display device according to claim 1, wherein the plurality of pixels includes an elastic region and a non-elastic region.

7. The display device according to claim 1, wherein a shape of the first wiring, a shape of the second wiring, a shape of the third wiring, and a shape of the fourth wiring include at least one of a straight line shape, a meandering shape, a rectangular wave shape and a wave shape.

8. The display device according to claim 1, wherein the first insulating film and the second insulating film include an organic resin.

9. The display device according to claim 3, further comprising:
   an image processing circuit,
   wherein
      the image processing circuit includes a circuit measuring at least one of a capacitance value of the first capacitor and a capacitance value of the second capacitor;
      an AD conversion circuit converting the measured capacitance value to digital data;
      a correction circuit correcting an image displayed on the plurality of pixels based on the digital data; and
      a memory storing data for correcting an image displayed on the plurality of pixels.

10. The display device according to claim 5, wherein the transistor includes a semiconductor film, a gate insulating film, and a gate electrode, a third insulating film is arranged between the flexible substrate and the semiconductor film, and a fourth insulating film is arranged above the gate electrode.

11. The display device according to claim 5, wherein the transistor is included in the non-elastic region.

12. The display device according to claim 10, wherein the first wiring is a scanning signal line and is electrically connected with the gate electrode, and the third wiring is an image signal line.

13. The display device according to claim 10, wherein the gate insulating film, the third insulating film and the fourth insulating film include at least one of silicon oxide, silicon nitride oxide, silicon oxynitride and silicon nitride.

* * * * *